US012787392B2

(12) United States Patent
(10) Patent No.: US 12,787,392 B2
(45) Date of Patent: *Nov. 3, 2026

Liu et al.

(54) BUFFER LAYER STRUCTURE TO IMPROVE GaN SEMICONDUCTORS

(71) Applicant: GlobalWafers Co., Ltd., Hsinchu (TW)

(72) Inventors: Jia-Zhe Liu, Hsinchu (TW); Chih-Yuan Chuang, Hsinchu (TW); Po Jung Lin, Hsinchu (TW); Hong Che Lin, Hsinchu (TW)

(73) Assignee: GLOBALWAFERS CO., LTD., Hsinchu (TW)

( * ) Notice: Subject to any disclaimer, the term of this patent is extended or adjusted under 35 U.S.C. 154(b) by 577 days.

This patent is subject to a terminal disclaimer.

(21) Appl. No.: 18/352,835

(22) Filed: Jul. 14, 2023

(65) Prior Publication Data

US 2023/0378278 A1 Nov. 23, 2023

Related U.S. Application Data

(60) Continuation-in-part of application No. 18/181,272, filed on Mar. 9, 2023, now Pat. No. 12,119,382, which is a division of application No. 16/226,265, filed on Dec. 19, 2018, now Pat. No. 11,705,489.

(60) Provisional application No. 62/617,484, filed on Jan. 15, 2018.

(51) Int. Cl.

*H10D 62/824* (2025.01)
*H10D 62/85* (2025.01)
*H10P 14/20* (2026.01)
*H10P 14/24* (2026.01)

(52) U.S. Cl.

CPC ....... *H10D 62/824* (2025.01); *H10D 62/8503* (2025.01); *H10P 14/3216* (2026.01); *H10P 14/3251* (2026.01); *H10P 14/24* (2026.01); *H10P 14/3252* (2026.01); *H10P 14/3254* (2026.01); *H10P 14/3414* (2026.01)

(58) Field of Classification Search

CPC .......................... H10D 62/824; H10D 62/8503

See application file for complete search history.

(56) References Cited

U.S. PATENT DOCUMENTS

2010/0244096 A1* 9/2010 Sato .................. H01L 21/02458 257/190

* cited by examiner

*Primary Examiner* — Vincent Wall

(74) *Attorney, Agent, or Firm* — Osha Bergman Watanabe & Burton LLP

(57) ABSTRACT

A heterostructure, includes: a substrate; and a buffer layer that includes a plurality of layers having a composition $Al_xIn_yGa_{1-x-y}N$, where $x\leq1$ and $0\leq y\leq1$; wherein the buffer layer has a first region that includes at least two layers, a second region that includes at least two layers, and a third region that includes at least two layers. The aluminum content varies continuously throughout a thickness of at least one of the layers.

18 Claims, 12 Drawing Sheets

BUFFER LAYER STRUCTURE TO IMPROVE GaN SEMICONDUCTORS

CROSS-REFERENCE TO RELATED APPLICATIONS

This application is a Continuation-In-Part application and claims priority to U.S. Patent Application No. 62/617,484 filed on Jan. 15, 2018, U.S. patent application Ser. No. 16/226,265 filed on Dec. 19, 2018, and U.S. patent application Ser. No. 18/181,272 filed on Mar. 9, 2023, which is a Divisional application of U.S. patent application Ser. No. 16/226,265. Each of these applications is herein incorporated by reference in its entirety.

BACKGROUND

Nitride semiconductors are used in the creation of new solid-state lighting, highly efficient amplifiers for wireless communications, advanced power electronics with unprecedentedly low losses, and a large array of new high-performance devices, for example.

Group III-V semiconductors, such as gallium nitride (GaN) or other III-Nitride materials (e.g., semiconductor compounds that include nitrogen and at least one element from group III of the Periodic Table of the Elements), are used in many microelectronic implementations in which high power density and high efficiency switching are required. Examples of such implementations include field-effect transistors (FETs) and high electron mobility transistors (HEMTs).

SUMMARY OF THE INVENTION

This summary is provided to introduce a selection of concepts that are further described below in the detailed description. This summary is not intended to identify key or essential features of the claimed subject matter, nor is it intended to be used as an aid in limiting the scope of the claimed subject matter.

In one aspect, embodiments disclosed herein relate to a heterostructure that includes a substrate; and a buffer layer comprising a plurality of layers having a composition $Al_xIn_yGa_{1-x-y}N$, where x≤1 and 0≤y≤1. The buffer layer has a first region, comprising at least two layers, one having a first layer profile and another having a second layer profile, wherein the first layer profile has a higher aluminum content than the second layer profile. The buffer layer further has a second region comprising at least two layers, one having a third layer profile and another having a fourth layer profile, wherein the third layer profile has a higher aluminum content than the fourth layer profile and the fourth layer profile has a lower aluminum content than the second layer profile of the first region. The buffer layer further has a third region comprising at least two layers, one having a fifth layer profile and another having a sixth layer profile, wherein the fifth layer profile has a higher aluminum content than the sixth layer profile and the sixth layer profile has a lower aluminum content than the fourth layer profile of the second region. The aluminum content varies continuously throughout a thickness of at least one of the layers according to the first, second, third, fourth, fifth, and sixth layer profiles.

In another aspect, embodiments disclosed herein relate to a heterostructure that includes a substrate; and a buffer layer. The buffer layer has a composition $Al_xIn_yGa_{1-x-y}N$, where x≤1 and 0≤y≤1, where the content of aluminum continuously varies throughout the thickness of the buffer layer and includes at least one layer of continuously increasing aluminum concentration and at least one layer of continuously decreasing aluminum concentration, along the growth direction of the buffer layer.

In yet another aspect, embodiments disclosed herein relate to a method for fabricating a heterostructure that includes depositing a buffer layer comprising a plurality of layers having a composition $Al_xIn_yGa_{1-x-y}N$, where x≤1 and 0≤y≤1 on a substrate. The buffer layer has a first region, comprising at least two layers, one having a first layer profile and another having a second layer profile, wherein the first layer profile has a higher aluminum content than the second layer profile. The buffer layer further has a second region comprising at least two layers, one having a third layer profile and another having a fourth layer profile, wherein the third layer profile has a higher aluminum content than the fourth layer profile and the fourth layer profile has a lower aluminum content than the second layer profile of the first region. The buffer layer further has a third region comprising at least two layers, one having a fifth layer profile and another having a sixth layer profile, wherein the fifth layer profile has a higher aluminum content than the sixth layer profile and the sixth layer profile has a lower aluminum content than the fourth layer profile of the second region. The aluminum content varies continuously throughout a thickness of at least one of the layers according to the first, second, third, fourth, fifth, and sixth layer profiles.

In yet another aspect, embodiments disclosed herein relate to a method for fabricating a heterostructure that includes depositing a buffer layer having a composition $Al_xIn_yGa_{1-x-y}N$, where x≤1 and 0≤y≤1, where the content of aluminum continuously varies throughout the thickness of the buffer layer and includes at least one layer of continuously increasing aluminum concentration and at least one layer of continuously decreasing aluminum concentration, along the growth direction of the buffer layer.

In yet another aspect, embodiments disclosed herein relate to a heterostructure that includes a substrate; and a buffer layer. The buffer layer includes a plurality of layers having a composition $Al_xIn_yGa_{1-x-y}N$, where x≤1 and 0≤y≤1. The buffer layer has a first region, comprising at least two layers, one having a first layer profile and another having a second layer profile, wherein the first layer profile has a higher average aluminum content than the second layer profile. The buffer layer further has a second region comprising at least two layers, one having a third layer profile and another having a fourth layer profile, wherein the third layer profile has a higher average aluminum content than the fourth layer profile and the fourth layer profile has a lower average aluminum content than the second layer profile of the first region. The buffer layer further has a third region comprising at least two layers, one having a fifth layer profile and another having a sixth layer profile, wherein the fifth layer profile has a higher average aluminum content than the sixth layer profile and the sixth layer profile has a lower average aluminum content than the fourth layer profile of the second region. The aluminum content varies continuously throughout a thickness of at least one of the layers according to the first, second, third, fourth, fifth, and sixth layer profiles.

In yet another aspect, embodiments disclosed herein relate to a method for fabricating a heterostructure that includes depositing a buffer layer comprising a plurality of layers having a composition $Al_xIn_yGa_{1-x-y}N$, where x≤1 and 0≤y≤1 on a substrate. The buffer layer has a first region, comprising at least two layers, one having a first layer profile and another having a second layer profile, wherein the first layer profile has a higher average aluminum content than the second layer profile. The buffer layer further has a second region comprising at least two layers, one having a third layer profile and another having a fourth layer profile, wherein the third layer profile has a higher average aluminum content than the fourth layer profile and the fourth layer profile has a lower average aluminum content than the second layer profile of the first region. The buffer layer further has a third region comprising at least two layers, one having a fifth layer profile and another having a sixth layer profile, wherein the fifth layer profile has a higher average aluminum content than the sixth layer profile and the sixth layer profile has a lower average aluminum content than the fourth layer profile of the second region. The aluminum content varies continuously throughout a thickness of at least one of the layers according to the first, second, third, fourth, fifth, and sixth layer profiles.

Other aspects and advantages of the claimed subject matter will be apparent from the following description and the appended claims.

DETAILED DESCRIPTION

Embodiments disclosed herein relate generally to semiconductor heterostructure compositions and methods of making said heterostructure compositions. More specifically, embodiments disclosed herein relate generally to semiconductor heterostructures that include a substrate and a buffer layer comprising a plurality of layers having a composition $Al_xIn_yGa_{1-x-y}N$, where x≤1 and 0≤y≤1, wherein the content of aluminum changes throughout the plurality of layers. Further details and embodiments discussing the variation in the content of aluminum changes will be discussed in detail below.

Group III-V semiconductors include III-Nitride materials formed of gallium nitride (GaN) and/or its alloys, such as aluminum gallium nitride (AlGaN), indium gallium nitride (InGaN), and aluminum indium gallium nitride (AlInGaN). These materials are semiconductor compounds that have a relatively wide, direct bandgap and strong piezoelectric polarizations, and can enable high breakdown fields and the creation of two-dimensional electron gases (2DEGs). As a result, III-Nitride materials, particularly GaN, are used in many microelectronic implementations in which high power density and high efficiency switching are required. Examples of such implementations include field-effect transistors (FETs), high electron mobility transistors (HEMTs), and diodes.

Figure 1:
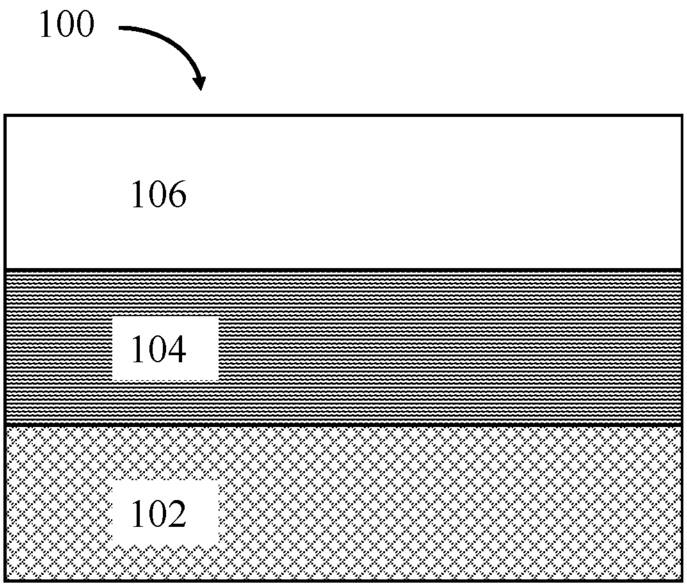
FIG. 1 depicts an embodiment of a semiconductor heterostructure according to the present disclosure.

However, direct epitaxial growth of a group III-V semiconductor on a substrate, such as silicon, can suffer from significant lattice spacing mismatch between the two layers of materials. This lattice spacing mismatch creates a highly stressed interface after cooling the materials and a stressed interface can lead to delamination of the layers, cracking, or other damage to the heterostructure. The inclusion of a buffer layer between the substrate and the group III-V semiconductor layer is one strategy used for minimizing the stress. Commonly used buffer layer materials include group III-V semiconductors (e.g., GaN, AN, and AlGaN, all of which may be doped with boron and/or indium) that are compositionally distinct from the working group III-V semiconductor layer. FIG. 1 shows a depiction of a semiconductor heterostructure 100 that includes a substrate 102, a buffer layer 104, and a working group III-V semiconductor layer 106. In one or more embodiments, the substrate of the heterostructure may be formed from one of silicon (Si), silicon carbide (SiC), gallium nitride (GaN), or sapphire ($Al_2O_3$). In one or more embodiments, the substrate may have a nucleation layer deposited onto its surface prior to depositing a buffer layer according to the present disclosure (i.e., a distinct layer in between 102 and 104 of FIG. 1). In one or more embodiments, the composition of the nucleation layer may be $Al_xIn_yGa_{1-x-y}N$, where x≤1 and 0≤y≤1, where the nucleation layer has a distinct composition from the buffer layer.

In one or more embodiments, according to the present disclosure semiconductor heterostructures include a substrate and a buffer layer, wherein the buffer layer is composed of a plurality of layers having a composition $Al_xIn_yGa_{1-x-y}N$, where x≤1 and 0≤y≤1, wherein the content of aluminum changes throughout the buffer layer and in some embodiments throughout one or more layers making up the buffer layer. In one or more embodiments, the buffer layer may have a graded structure and/or a superlattice structure. More specifically, a graded structure refers to a buffer layer that includes at least one layer that has a concentration variation throughout the structure (e.g., the value of X in $Al_xGa_{1-x}N$ varies continuously throughout the layer), while a superlattice structure is a laminated structure that comprises at least two compositionally different layers repeated more than once in a consistent and repetitive manner throughout the structure.

For a simple example, a first layer of a buffer layer may be deposited on the substrate and the first layer may have an aluminum content that is higher than a second layer of the buffer layer that is deposited onto the first layer. There may be many such layers deposited sequentially to create the final buffer layer structure that a working group III-V semiconductor layer may be eventually deposited on and the aluminum content can vary in a multitude of different ways throughout the layers making up the buffer layer. The term "aluminum content" is meant to represents the value for "x" in the buffer layer formula of $Al_xIn_yGa_{1-x-y}N$, where x≤1 and 0≤y≤1. A particular layer may have a fixed aluminum content (i.e., "x" is fixed) or it may have an aluminum content that varies continuously throughout the layer (i.e., "x" changes continuously as the layer is deposited). The term "substantially the same" indicates a margin that is less than and/or greater than 10%, for example, 5%, of the respective value. An "average aluminum content" refers to an average value for "x" throughout a thickness of a layer having a constant aluminum content, a continuously increasing aluminum content, or a continuously decreasing aluminum content. For example, in the case of a layer having a constant aluminum content, the average aluminum content of that layer is the aluminum content at any point of the thickness along the growth direction of the layer; in the case of a layer having a continuously increasing aluminum content or a continuously decreasing aluminum content, the average aluminum content of that layer is the aluminum content at the midpoint of the thickness along the growth direction of the layer or an average of the highest aluminum content and the lowest aluminum content within the layer. In general, a "layer profile" may be defined as a particular layer's aluminum content and its variation within the layer. There may be multiple distinct layers within a buffer layer that have the same layer profile and two distinct layer profiles may be repeated in a sequential fashion within a buffer layer according to the present disclosure. In the description below, an attempt will be made to describe a variety of embodiments of layering that are envisioned to create buffer layer structures according to the present disclosure. However, the present disclosure is not intended to be limited to only those embodiments described and may also include other layer combinations of $Al_xIn_yGa_{1-x-y}N$ having fixed aluminum content, variable aluminum content, or a combination of both fixed and variable aluminum content. In these embodiments, a "growth direction" may be mentioned and this term is intended to mean the direction perpendicular to the upper surface of the substrate that the layers constituting the buffer layer are sequentially deposited in. Further, a particular layer's thickness may be a measure of the dimension of the layer in the growth direction. In one or more embodiments the thickness of each particular layer may independently be between about 1 nm and 50 nm, or between about 2 nm and 30 nm, or between about 5 nm and 15 nm. In one or more embodiments, a particular layer with higher aluminum concentration percentage may be thinner than a particular layer with lower aluminum centration percentage. Conversely, in one or more embodiments, a particular layer with lower aluminum concentration percentage may be thicker than a particular layer with higher aluminum concentration percentage. In one or more embodiments a buffer layer, composed of many individual layers, may have a total thickness that is not particularly limited but, in some instances, the total thickness may be between about 100 nm and 1000 nm or between about 200 nm and 500 nm. In one or more embodiments, the buffer layer may have the total thickness greater than 1000 nm. For example, the buffer layer may be composed of at least 20 individual layers each having a thickness of at least 50 nm.

Figure 2:
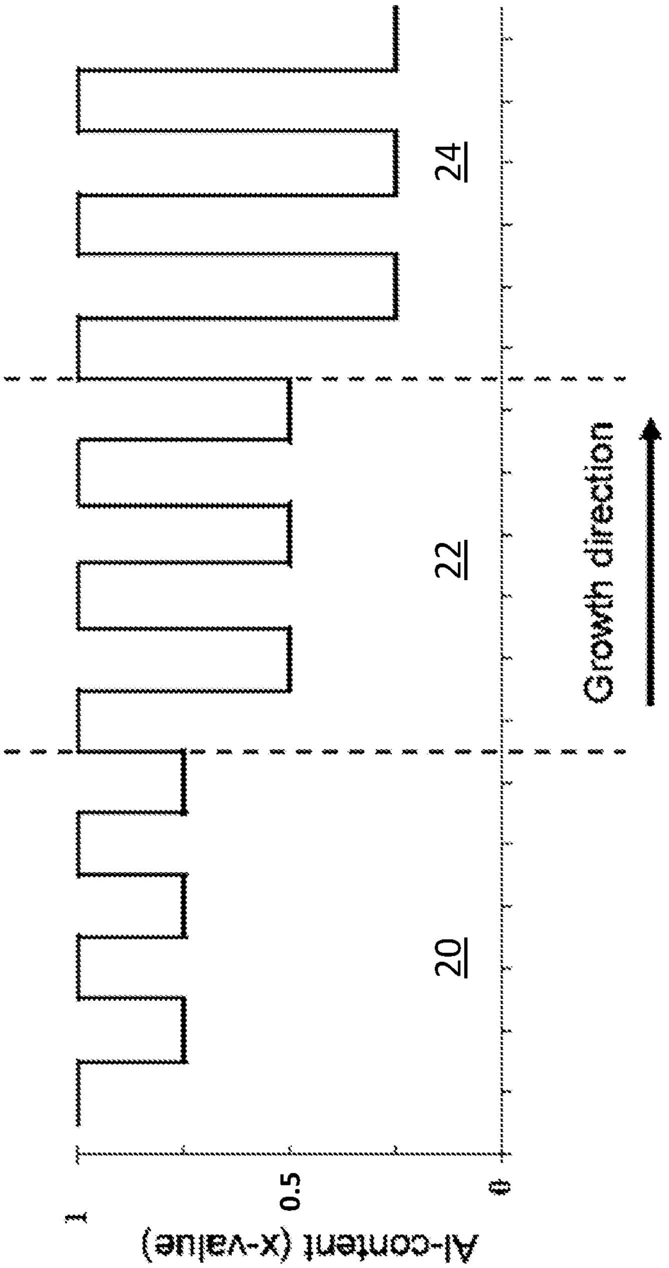
FIG. 2 depicts an embodiment of the composition of a buffer layer according to the present disclosure.

FIG. 2 depicts an embodiment of the composition of a buffer layer according to the present disclosure. As depicted, the aluminum content in a buffer layer having a formula of $Al_xIn_yGa_{1-x-y}N$, where x≤1 and 0≤y≤1, may be varied throughout the thickness of the buffer layer so that the buffer layer has a first region 20, comprising at least two layers, one having a first layer profile and another having a second layer profile, wherein the first layer profile has a higher aluminum content than the second layer profile; wherein the buffer layer has a second region 22 comprising at least two layers, one having a third layer profile and another with a fourth layer profile, wherein the third layer profile has a higher aluminum content than the fourth layer profile and the fourth layer profile has a lower aluminum content than the second layer profile of the first region; and wherein the buffer layer has a third region 24 comprising at least two layers, one having a fifth layer profile and another with a sixth layer profile, wherein the fifth layer profile has a higher aluminum content than the sixth layer profile and the sixth layer profile has a lower aluminum content than the fourth layer profile of the second region.

The aluminum content is shown as the y-axis in FIG. 2 and represents the value for "x" in the buffer layer formula of $Al_xIn_yGa_{1-x-y}N$, where x≤1 and 0≤y≤1. Further, in FIG. 2 each of the layers have a constant aluminum content throughout their thickness (i.e., the values of the aluminum content in each layer are parallel to the x-axis). FIG. 2 depicts the buffer layer in the first region 20 repeating the first layer profile and the second layer profile three times however, in one or more embodiments, a buffer layer may repeat the first layer profile and second layer profile in the first region 20 at least 5 times or at least 10 times and up to 20 times. Similarly, the buffer layer in the second region 22 is shown in FIG. 2 repeating the third layer profile and the fourth layer profile three times however, in one or more embodiments, a buffer layer may repeat the third layer profile and fourth layer profile in the second region 22 at least 5 times or at least 10 times and up to 20 times. Finally, the buffer layer in the third region 24 is shown in FIG. 2 repeating the fifth layer profile and the sixth layer profile three times however, in one or more embodiments, a buffer layer may repeat the fifth layer profile and sixth layer profile in the third region 24 at least 5 times or at least 10 times and up to 20 times.

In embodiments that have a buffer layer using a similar layer profile as what is depicted in FIG. 2 the aluminum content for the first layer profile, third layer profile, and fifth layer profile may be in a range from 0.9 to 1, for the second layer profile it may be in a range from 0.5 to 0.9, for the fourth layer profile it may be in a range from 0.25 to 0.5, and for the sixth layer profile it may be in a range from 0.01 to 0.25. In one or more embodiments of the present disclosure, the terminal layer of the buffer layer (i.e., the last layer deposited prior to depositing the working group III-V semiconductor layer) may have an aluminum content equal to or less than 0.5, or equal to or less than 0.35, or equal to or less than 0.25.

Figure 3:
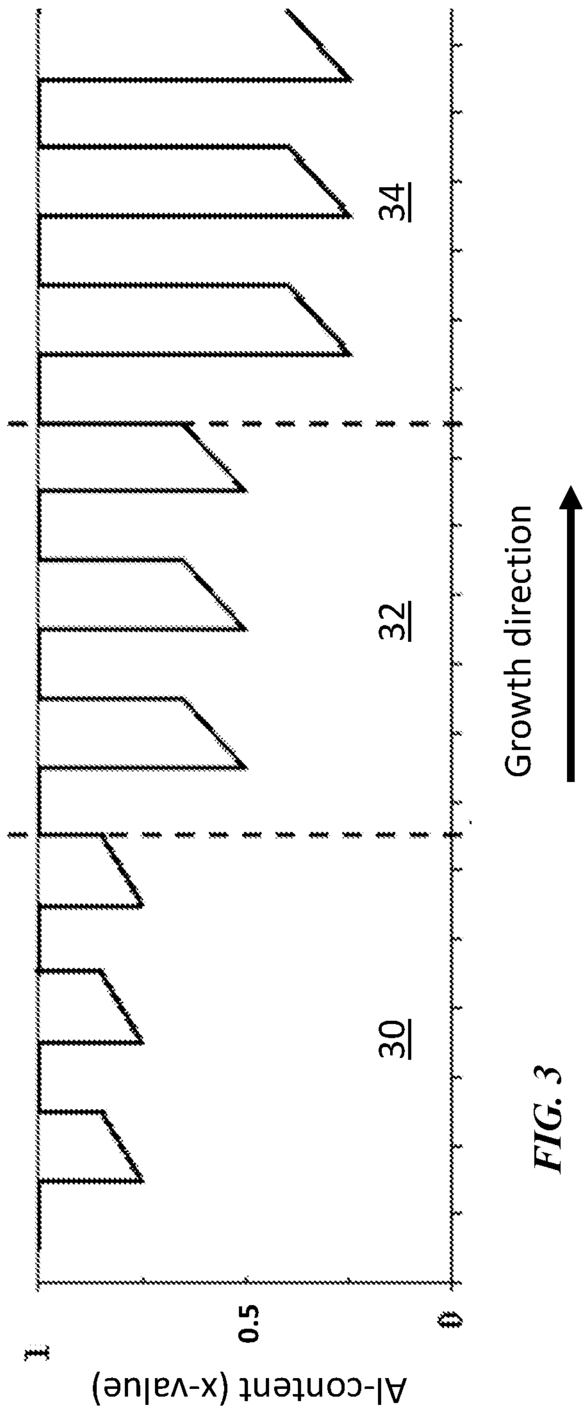
FIG. 3 depicts an embodiment of the composition of a buffer layer according to the present disclosure.

FIG. 3 depicts an embodiment of the composition of a buffer layer according to the present disclosure. As depicted, the aluminum content in a buffer layer having a formula of $Al_xIn_yGa_{1-x-y}N$, where x≤1 and 0≤y≤1, may be varied throughout the thickness of the buffer layer so that the buffer layer has a first region 30 comprising at least two layers, one having a first layer profile and another having a second layer profile, wherein the first layer profile has a higher average aluminum content than the second layer profile; wherein the buffer layer has a second region 32 comprising at least two layers, one having a third layer profile and another with a fourth layer profile, wherein the third layer profile has a higher average aluminum content than the fourth layer profile and the fourth layer profile has a lower average aluminum content than the second layer profile of the first region; and wherein the buffer layer has a third region 34 comprising at least two layers, one having a fifth layer profile and another with a sixth layer profile, wherein the fifth layer profile has a higher average aluminum content than the sixth layer profile and the sixth layer profile has a lower average aluminum content than the fourth layer profile of the second region. Also, an initial aluminum content of the second layer profile in the growth direction is higher than an initial aluminum content of the fourth layer profile in the growth direction, and the initial aluminum content of the fourth layer profile in the growth direction is higher than an initial aluminum content of the sixth layer profile in the growth direction. As used herein, the "initial aluminum content" of a specific layer profile represents the value for "x" in the layer having that specific layer profile at a position in the growth direction where it is closest to a preceding layer on which the layer having that specific layer profile grows.

The aluminum content is shown as the y-axis in FIG. 3 and represents the value for "x" in the buffer layer formula of $Al_xIn_yGa_{1-x-y}N$, where x≤1 and 0≤y≤1. Further, in FIG. 3 each of the layers with an odd numbered layer profile have a constant aluminum content throughout their thickness (i.e., the values of the aluminum content in each layer are parallel to the x-axis), while each of the layers with an even numbered layer profile have a variable aluminum content that continuously increases throughout their thickness in the growth direction. FIG. 3 depicts the buffer layer in the first region 30 repeating the first layer profile and the second layer profile three times however, in one or more embodiments, a buffer layer may repeat the first layer profile and second layer profile in the first region 30 at least 5 times or at least 10 times and up to 20 times. Similarly, the buffer layer in the second region 32 is shown in FIG. 3 repeating the third layer profile and the fourth layer profile three times however, in one or more embodiments, a buffer layer may repeat the third layer profile and fourth layer profile in the second region 32 at least 5 times or at least 10 times and up to 20 times. Finally, the buffer layer in the third region 34 is shown in FIG. 3 repeating the fifth layer profile and the sixth layer profile three times however, in one or more embodiments, a buffer layer may repeat the fifth layer profile and sixth layer profile in the third region 34 at least 5 times or at least 10 times and up to 20 times.

In embodiments that have a buffer layer using a similar layer profile as what is depicted in FIG. 3 the aluminum content for the first layer profile, third layer profile, and fifth layer profile may be independently any constant value between 0.9 and 1. In the embodiment shown, the aluminum content for each of the first layer profile, third layer profile, and fifth layer profile may constantly be 1. A difference between a highest aluminum content and a lowest aluminum content in each of the layers according to the second layer profile, fourth layer profile, and sixth layer profile is independently no more than 0.2. For example, the aluminum content for the second layer profile may be in a range from 0.65 to 0.85. The average aluminum content of the second layer profile may be, for example, any value between 0.65 and 0.85. The aluminum content for the fourth layer profile may be, for example, in a range from 0.4 to 0.6. The average aluminum content of the fourth layer profile may be, for example, any value between 0.4 and 0.6. The aluminum content for the sixth layer profile may be, for example, in a range from 0.15 to 0.35. The average aluminum content of the sixth layer profile may be, for example, any value between 0.15 and 0.35. In one or more embodiments of the present disclosure, the terminal layer of the buffer layer (i.e., the last layer deposited prior to depositing the working group III-V semiconductor layer) may have at least a portion of the layer with an aluminum content equal to or less than 0.35, or equal to or less than 0.25.

Figure 4:
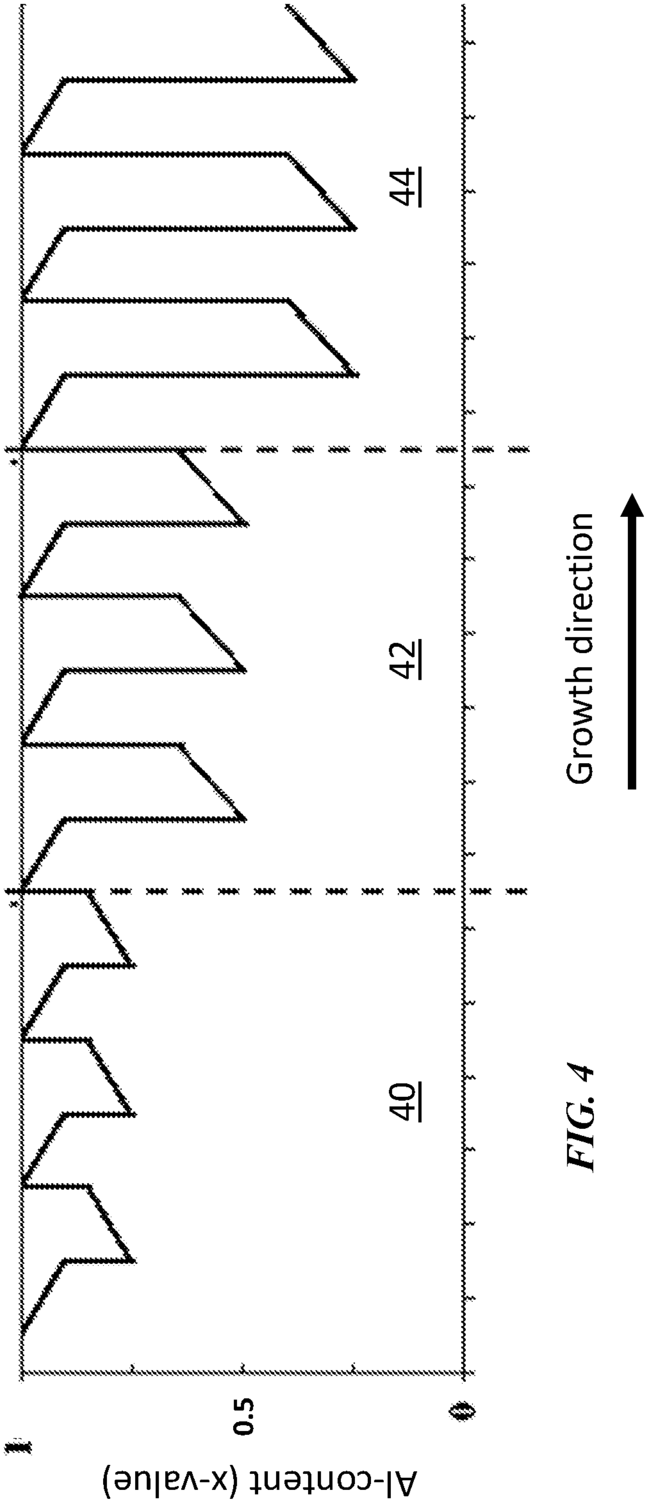
FIG. 4 depicts an embodiment of the composition of a buffer layer according to the present disclosure.

FIG. 4 depicts an embodiment of the composition of a buffer layer according to the present disclosure. As depicted, the aluminum content in a buffer layer having a formula of $Al_xIn_yGa_{1-x-y}N$, where x≤1 and 0≤y≤1, may be varied throughout the thickness of the buffer layer so that the buffer layer has a first region 40, comprising at least two layers, one having a first layer profile and another having a second layer profile, wherein the first layer profile has a higher average aluminum content than the second layer profile; wherein the buffer layer has a second region 42 comprising at least two layers, one having a third layer profile and another with a fourth layer profile, wherein the third layer profile has a higher average aluminum content than the fourth layer profile and the fourth layer profile has a lower average aluminum content than the second layer profile of the first region; and wherein the buffer layer has a third region 44 comprising at least two layers, one having a fifth layer profile and another with a sixth layer profile, wherein the fifth layer profile has a higher average aluminum content than the sixth layer profile and the sixth layer profile has a lower average aluminum content than the fourth layer profile of the second region. Also, an initial aluminum content of the second layer profile in the growth direction is higher than an initial aluminum content of the fourth layer profile in the growth direction, and the initial aluminum content of the fourth layer profile in the growth direction is higher than an initial aluminum content of the sixth layer profile in the growth direction.

The aluminum content is shown as the y-axis in FIG. 4 and represents the value for "x" in the buffer layer formula of $Al_xIn_yGa_{1-x-y}N$, where x≤1 and 0≤y≤1. Further, in FIG. 4 each of the layers with an odd numbered layer profile a variable aluminum content that continuously decreases throughout their thickness in the growth direction, while each of the layers with an even numbered layer profile have a variable aluminum content that continuously increases throughout their thickness in the growth direction. FIG. 4 depicts the buffer layer in the first region 40 repeating the first layer profile and the second layer profile three times however, in one or more embodiments, a buffer layer may repeat the first layer profile and second layer profile in the first region 40 at least 5 times or at least 10 times and up to 20 times. Similarly, the buffer layer in the second region 42 is shown in FIG. 4 repeating the third layer profile and the fourth layer profile three times however, in one or more embodiments, a buffer layer may repeat the third layer profile and fourth layer profile in the second region 42 at least 5 times or at least 10 times and up to 20 times. Finally, the buffer layer in the third region 44 is shown in FIG. 4 repeating the fifth layer profile and the sixth layer profile three times however, in one or more embodiments, a buffer layer may repeat the fifth layer profile and sixth layer profile in the third region 44 at least 5 times or at least 10 times and up to 20 times.

In embodiments that have a buffer layer using a similar layer profile as what is depicted in FIG. 4 the aluminum content for the first layer profile, third layer profile, and fifth layer profile may be independently in a range from 0.9 to 1. The average aluminum content of the first layer profile, third layer profile, and fifth layer profile may be, for example, independently any value between 0.9 and 1. A difference between a highest aluminum content and a lowest aluminum content in each of the layers according to the second layer profile, fourth layer profile, and sixth layer profile is independently no more than 0.2. For example, the aluminum content for the second layer profile may be in a range from 0.65 to 0.85. The average aluminum content of the second layer profile may be, for example, any value between 0.65 and 0.85. The aluminum content for the fourth layer profile may be in a range from 0.4 to 0.6. The average aluminum content of the fourth layer profile may be, for example, any value between 0.4 and 0.6. The aluminum content for the sixth layer profile may be in a range from 0.15 to 0.35. The average aluminum content of the sixth layer profile may be, for example, any value between 0.15 and 0.35. In one or more embodiments of the present disclosure, the terminal layer of the buffer layer (i.e., the last layer deposited prior to depositing the working group III-V semiconductor layer) may have at least a portion of the layer with an aluminum content equal to or less than 0.35, or equal to or less than 0.25.

Figure 5:
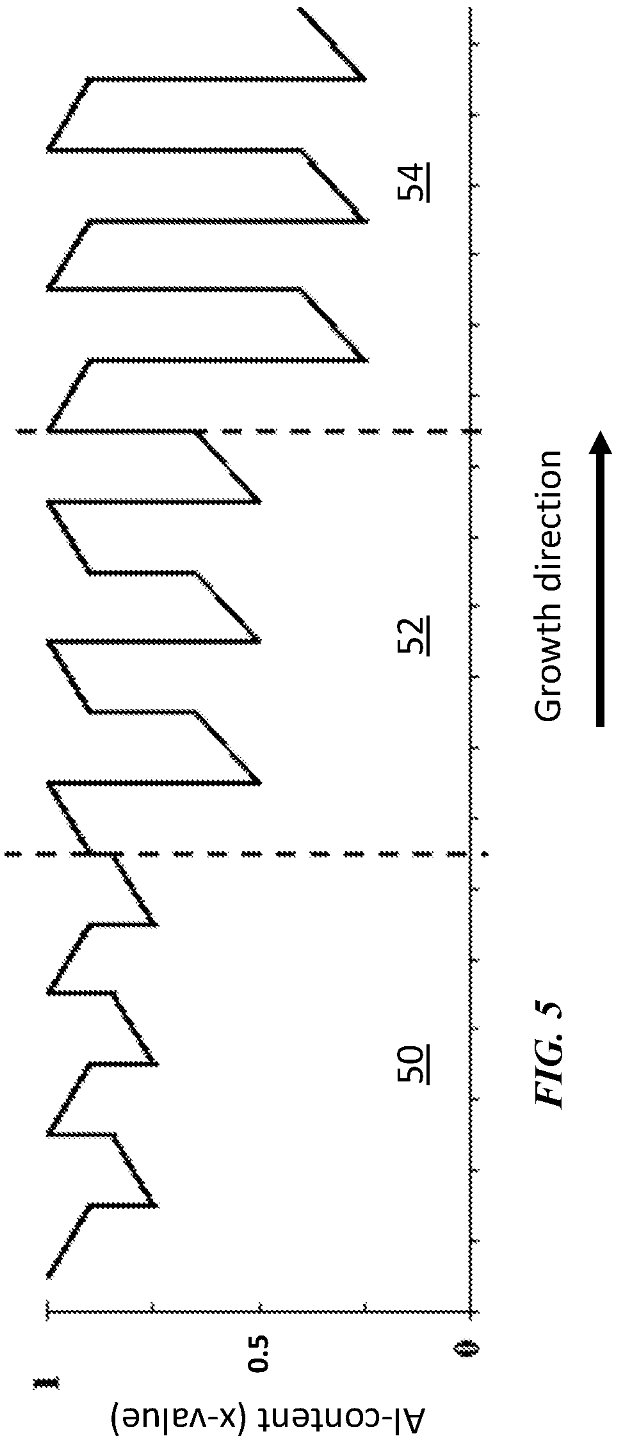
FIG. 5 depicts an embodiment of the composition of a buffer layer according to the present disclosure.

FIG. 5 depicts an embodiment of the composition of a buffer layer according to the present disclosure. As depicted, the aluminum content in a buffer layer having a formula of $Al_xIn_yGa_{1-x-y}N$, where x≤1 and 0≤y≤1, may be varied throughout the thickness of the buffer layer so that the buffer layer has a first region 50, comprising at least two layers, one having a first layer profile and another having a second layer profile, wherein the first layer profile has a higher average aluminum content than the second layer profile; wherein the buffer layer has a second region 52 comprising at least two layers, one having a third layer profile and another with a fourth layer profile, wherein the third layer profile has a higher average aluminum content than the fourth layer profile and the fourth layer profile has a lower average aluminum content than the second layer profile of the first region; and wherein the buffer layer has a third region 54 comprising at least two layers, one having a fifth layer profile and another with a sixth layer profile, wherein the fifth layer profile has a higher average aluminum content than the sixth layer profile and the sixth layer profile has a lower average aluminum content than the fourth layer profile of the second region. Also, an initial aluminum content of the second layer profile in the growth direction is higher than an initial aluminum content of the fourth layer profile in the growth direction, and the initial aluminum content of the fourth layer profile in the growth direction is higher than an initial aluminum content of the sixth layer profile in the growth direction.

The aluminum content is shown as the y-axis in FIG. 5 and represents the value for "x" in the buffer layer formula of $Al_xIn_yGa_{1-x-y}N$, where x≤1 and 0≤y≤1. Further, in FIG. 5 the layers with a first layer profile and a fifth layer profile have a variable aluminum content that continuously decreases throughout their thickness in the growth direction, while the layers with a third layer profile, second layer profile, fourth layer profile, and sixth layer profile have a variable aluminum content that continuously increases throughout their thickness in the growth direction. FIG. 5 depicts the buffer layer in the first region 50 repeating the first layer profile and the second layer profile three times however, in one or more embodiments, a buffer layer may repeat the first layer profile and second layer profile in the first region 50 at least 5 times or at least 10 times and up to 20 times. Similarly, the buffer layer in the second region 52 is shown in FIG. 5 repeating the third layer profile and the fourth layer profile three times however, in one or more embodiments, a buffer layer may repeat the third layer profile and fourth layer profile in the second region 52 at least 5 times or at least 10 times and up to 20 times. Finally, the buffer layer in the third region 54 is shown in FIG. 5 repeating the fifth layer profile and the sixth layer profile three times however, in one or more embodiments, a buffer layer may repeat the fifth layer profile and sixth layer profile in the third region 54 at least 5 times or at least 10 times and up to 20 times.

In embodiments that have a buffer layer using a similar layer profile as what is depicted in FIG. 5 the aluminum content for the first layer profile, third layer profile, and fifth layer profile may be independently in a range from 0.9 to 1. The average aluminum content of the first layer profile, third layer profile, and fifth layer profile may be, for example, independently any value between 0.9 and 1. A difference between a highest aluminum content and a lowest aluminum content in each of the layers according to the second layer profile, fourth layer profile, and sixth layer profile is independently no more than 0.2. For example, the aluminum content for the second layer profile may be in a range from 0.65 to 0.85. The average aluminum content of the second layer profile may be, for example, any value between 0.65 and 0.85. The aluminum content for the fourth layer profile may be in a range from 0.4 to 0.6. The average aluminum content of the fourth layer profile may be, for example, any value between 0.4 and 0.6. The aluminum content for the sixth layer profile may be in a range from 0.15 to 0.35. The average aluminum content of the sixth layer profile may be, for example, any value between 0.15 and 0.35. In one or more embodiments of the present disclosure, the terminal layer of the buffer layer (i.e., the last layer deposited prior to depositing the working group III-V semiconductor layer) may have at least a portion of the layer with an aluminum content equal to or less than 0.35, or equal to or less than 0.25.

Figure 6:
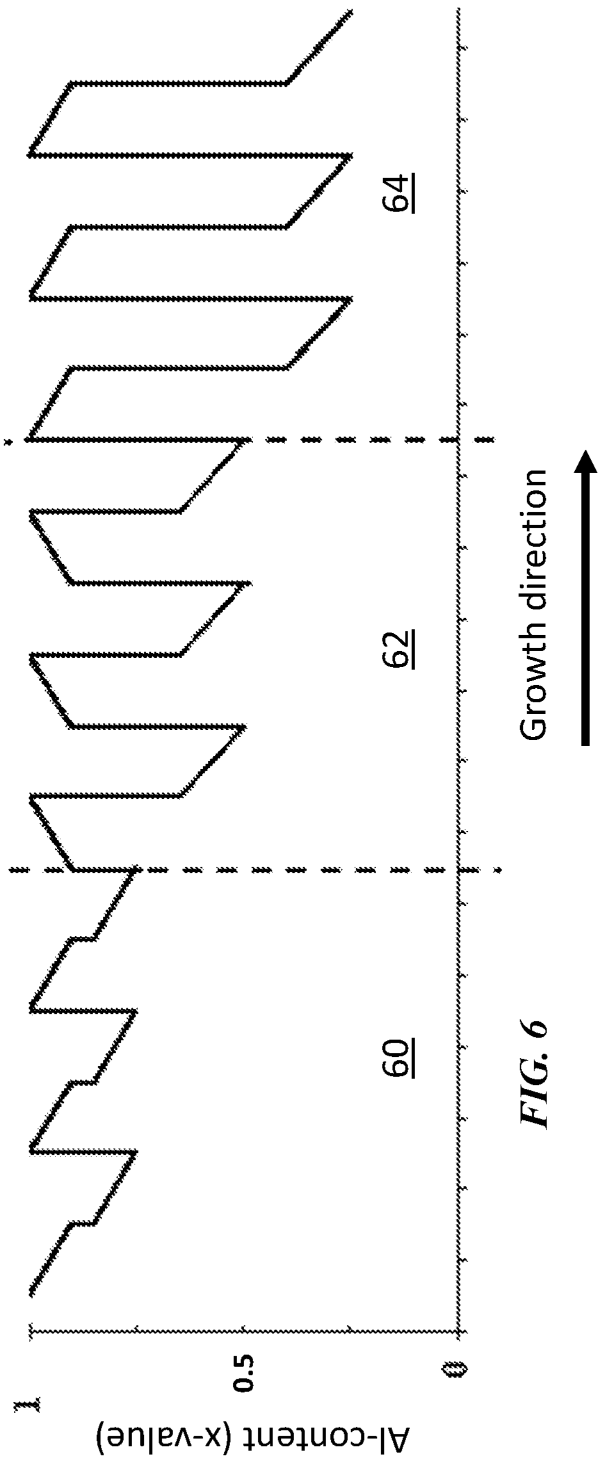
FIG. 6 depicts an embodiment of the composition of a buffer layer according to the present disclosure.

FIG. 6 depicts an embodiment of the composition of a buffer layer according to the present disclosure. As depicted, the aluminum content in a buffer layer having a formula of $Al_xIn_yGa_{1-x-y}N$, where x≤1 and 0≤y≤1, may be varied throughout the thickness of the buffer layer so that the buffer layer has a first region 60, comprising at least two layers, one having a first layer profile and another having a second layer profile, wherein the first layer profile has a higher average aluminum content than the second layer profile; wherein the buffer layer has a second region 62 comprising at least two layers, one having a third layer profile and another with a fourth layer profile, wherein the third layer profile has a higher average aluminum content than the fourth layer profile and the fourth layer profile has a lower average aluminum content than the second layer profile of the first region; and wherein the buffer layer has a third region 64 comprising at least two layers, one having a fifth layer profile and another with a sixth layer profile, wherein the fifth layer profile has a higher average aluminum content than the sixth layer profile and the sixth layer profile has a lower average aluminum content than the fourth layer profile of the second region. Also, an initial aluminum content of the second layer profile in the growth direction is higher than an initial aluminum content of the fourth layer profile in the growth direction, and the initial aluminum content of the fourth layer profile in the growth direction is higher than an initial aluminum content of the sixth layer profile in the growth direction.

The aluminum content is shown as the y-axis in FIG. 6 and represents the value for "x" in the buffer layer formula of $Al_xIn_yGa_{1-x-y}N$, where x≤1 and 0≤y≤1. Further, in FIG. 6 the layers with a first layer profile, second layer profile, fourth layer profile, fifth layer profile and sixth layer profile have a variable aluminum content that continuously decreases throughout their thickness in the growth direction, while the layers with a third layer profile have a variable aluminum content that continuously increases throughout their thickness in the growth direction. FIG. 6 depicts the buffer layer in the first region 60 repeating the first layer profile and the second layer profile three times however, in one or more embodiments, a buffer layer may repeat the first layer profile and second layer profile in the first region 60 at least 5 times or at least 10 times and up to 20 times. Similarly, the buffer layer in the second region 62 is shown in FIG. 6 repeating the third layer profile and the fourth layer profile three times however, in one or more embodiments, a buffer layer may repeat the third layer profile and fourth layer profile in the second region 62 at least 5 times or at least 10 times and up to 20 times. Finally, the buffer layer in the third region 64 is shown in FIG. 6 repeating the fifth layer profile and the sixth layer profile three times however, in one or more embodiments, a buffer layer may repeat the fifth layer profile and sixth layer profile in the third region 64 at least 5 times or at least 10 times and up to 20 times.

In embodiments that have a buffer layer using a similar layer profile as what is depicted in FIG. 6 the aluminum content for the first layer profile, third layer profile, and fifth layer profile may be independently in a range from 0.9 to 1. The average aluminum content of the first layer profile, third layer profile, and fifth layer profile may be, for example, independently any value between 0.9 and 1. A difference between a highest aluminum content and a lowest aluminum content in each of the layers according to the second layer profile, fourth layer profile, and sixth layer profile is independently no more than 0.2. For example, the aluminum content for the second layer profile may be in a range from 0.65 to 0.85. The average aluminum content of the second layer profile may be, for example, any value between 0.65 and 0.85. The aluminum content for the fourth layer profile may be in a range from 0.4 to 0.6. The average aluminum content of the fourth layer profile may be, for example, any value between 0.4 and 0.6. The aluminum content for the sixth layer profile may be in a range from 0.15 to 0.35. The average aluminum content of the sixth layer profile may be, for example, any value between 0.15 and 0.35. In one or more embodiments of the present disclosure, the terminal layer of the buffer layer (i.e., the last layer deposited prior to depositing the working group III-V semiconductor layer) may have at least a portion of the layer with an aluminum content equal to or less than 0.35, or equal to or less than 0.25.

Figure 7:
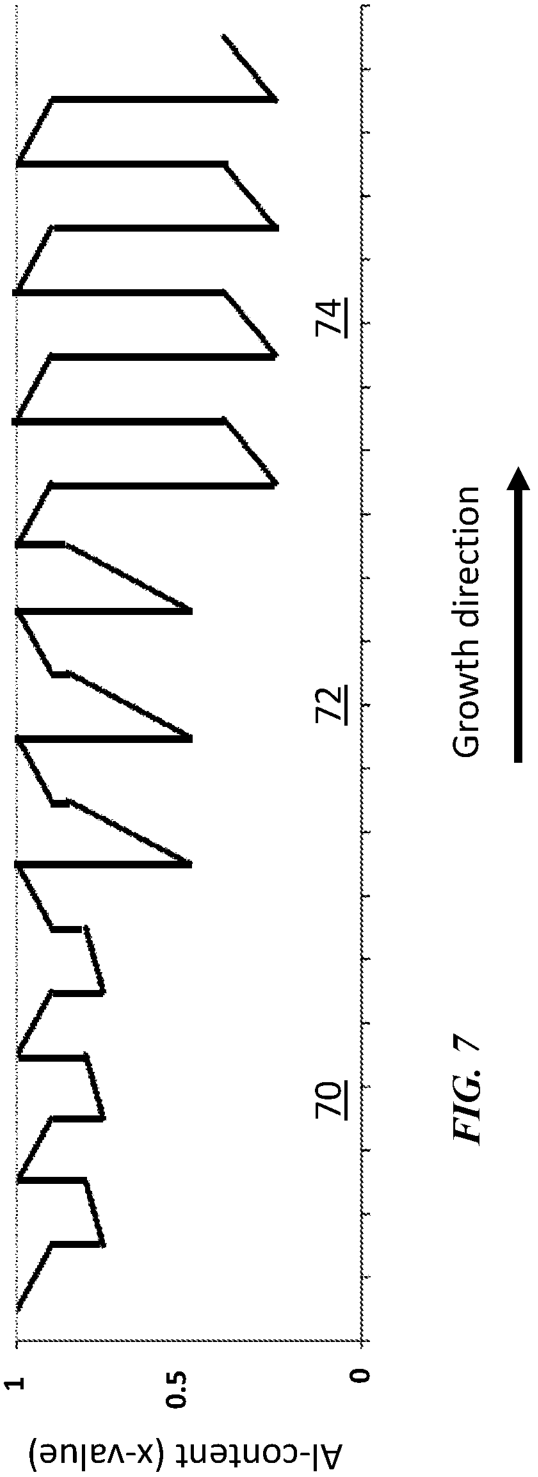
FIG. 7 depicts an embodiment of the composition of a buffer layer according to the present disclosure.

FIG. 7 depicts an embodiment of the composition of a buffer layer according to the present disclosure. As depicted, the aluminum content in a buffer layer having a formula of $Al_xIn_yGa_{1-x-y}N$, where x≤1 and 0≤y≤1, may be varied throughout the thickness of the buffer layer so that the buffer layer has a first region 70, comprising at least two layers, one having a first layer profile and another having a second layer profile, wherein the first layer profile has a higher average aluminum content than the second layer profile; wherein the buffer layer has a second region 72 comprising at least two layers, one having a third layer profile and another with a fourth layer profile, wherein the third layer profile has a higher average aluminum content than the fourth layer profile and the fourth layer profile has a lower average aluminum content than the second layer profile of the first region; and wherein the buffer layer has a third region 74 comprising at least two layers, one having a fifth layer profile and another with a sixth layer profile, wherein the fifth layer profile has a higher average aluminum content than the sixth layer profile and the sixth layer profile has a lower average aluminum content than the fourth layer profile of the second region. As shown in FIG. 7, at least a portion of each layer having the fourth layer profile has a higher aluminum content than at least a portion of each layer having the second layer profile. Also, an initial aluminum content of the second layer profile in the growth direction is higher than an initial aluminum content of the fourth layer profile in the growth direction, and the initial aluminum content of the fourth layer profile in the growth direction is higher than an initial aluminum content of the sixth layer profile in the growth direction.

The aluminum content is shown as the y-axis in FIG. 7 and represents the value for "x" in the buffer layer formula of $Al_xIn_yGa_{1-x-y}N$, where x≤1 and 0≤y≤1. Further, in FIG. 7 the layers with a first layer profile, second layer profile, fifth layer profile and sixth layer profile have a variable aluminum content that continuously decreases throughout their thickness in the growth direction, while the layers with a third layer profile and a fourth layer profile have a variable aluminum content that continuously increases throughout their thickness in the growth direction. FIG. 7 depicts the buffer layer in the first region 70 repeating the first layer profile and the second layer profile three times however, in one or more embodiments, a buffer layer may repeat the first layer profile and second layer profile in the first region 70 at least 5 times or at least 10 times and up to 20 times. Similarly, the buffer layer in the second region 72 is shown in FIG. 7 repeating the third layer profile and the fourth layer profile three times however, in one or more embodiments, a buffer layer may repeat the third layer profile and fourth layer profile in the second region 72 at least 5 times or at least 10 times and up to 20 times. Finally, the buffer layer in the third region 74 is shown in FIG. 7 repeating the fifth layer profile and the sixth layer profile three times however, in one or more embodiments, a buffer layer may repeat the fifth layer profile and sixth layer profile in the third region 74 at least 5 times or at least 10 times and up to 20 times.

In embodiments that have a buffer layer using a similar layer profile as what is depicted in FIG. 7 the aluminum content for the first layer profile, third layer profile, and fifth layer profile may be independently in a range from 0.9 to 1. The average aluminum content of the first layer profile, third layer profile, and fifth layer profile may be, for example, independently any value between 0.9 and 1. A difference between a highest aluminum content and a lowest aluminum content in each of the layers according to the second layer profile, fourth layer profile, and sixth layer profile is independently no more than 0.2, for example, 0.05, 0.1, 0.15, or 0.2. Further, the difference between the highest aluminum content and the lowest aluminum content in each of the layers according to the second layer profile, fourth layer profile, and sixth layer profile is different from each other. In the embodiment shown, the difference between the highest aluminum content and the lowest aluminum content in the layer according to the second layer profile is 0.05, the difference between the highest aluminum content and the lowest aluminum content in the layer according to the fourth layer profile is 0.2, and the difference between the highest aluminum content and the lowest aluminum content in the layer according to the sixth layer profile is 0.1. For example, the highest aluminum content and the lowest aluminum content for the second layer profile may be 0.8 and 0.75, respectively. In this example, the average aluminum content of the second layer profile is from about 0.77 to about 0.78. The highest aluminum content and the lowest aluminum content for the fourth layer profile may be 0.85 and 0.65, respectively. In this example, the average aluminum content of the fourth layer profile is about 0.75. The highest aluminum content and the lowest aluminum content for the sixth layer profile may be 0.35 and 0.25, respectively. In this example, the average aluminum content of the sixth layer profile is about 0.3. In one or more embodiments of the present disclosure, the terminal layer of the buffer layer (i.e., the last layer deposited prior to depositing the working group III-V semiconductor layer) may have at least a portion of the layer with an aluminum content equal to or less than 0.35, or equal to or less than 0.25.

In embodiments that have a buffer layer using a similar layer profile as what is depicted in FIG. 7, as described above, the fourth layer profile has a lower average aluminum content than the second layer profile, and the sixth layer profile has a lower average aluminum content than the fourth layer profile. On the other hand, the difference between the highest aluminum content and the lowest aluminum content in each of the layers according to the second layer profile, fourth layer profile, and sixth layer profile are different from each other. As such, in one or more embodiments, some or all of the ranges over which the aluminum content changes throughout the thickness of the layers according to the second layer profile, fourth layer profile, and sixth layer profile may overlap each other. In the embodiment shown in FIG. 7, the range over which the aluminum content changes throughout the thickness of the layer according to the second layer profile overlap the range over which the aluminum content changes throughout the thickness of the layer according to the fourth layer profile. In particular, the highest aluminum content in the layer according to the second layer profile is lower than the highest aluminum content in the layer according to the fourth layer profile, and the lowest aluminum content in the layer according to the second layer profile is higher than the lowest aluminum content in the layer according to the fourth layer profile. However, as stated above, the fourth layer profile has a lower average aluminum content than the second layer profile.

Figure 8:
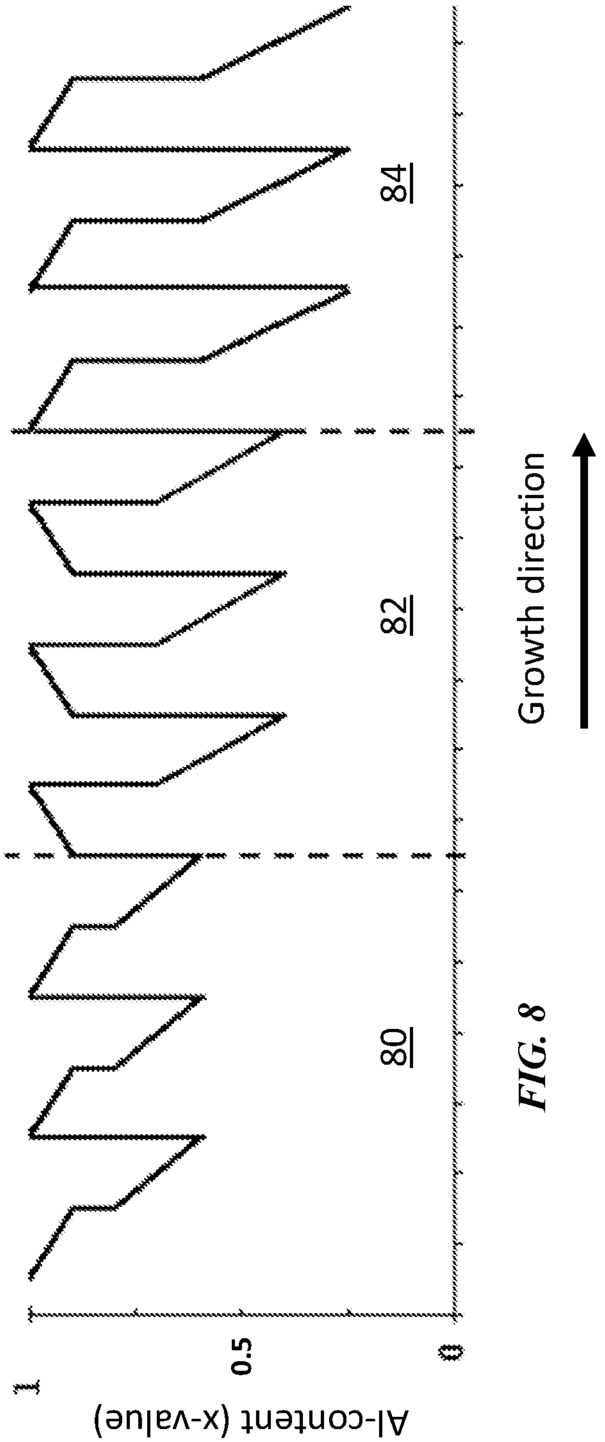
FIG. 8 depicts an embodiment of the composition of a buffer layer according to the present disclosure.

FIG. 8 depicts an embodiment of the composition of a buffer layer according to the present disclosure. As depicted, the aluminum content in a buffer layer having a formula of $Al_xIn_yGa_{1-x-y}N$, where x≤1 and 0≤y≤1, may be varied throughout the thickness of the buffer layer so that the buffer layer has a first region 80, comprising at least two layers, one having a first layer profile and another having a second layer profile, wherein the first layer profile has a higher average aluminum content than the second layer profile; wherein the buffer layer has a second region 82 comprising at least two layers, one having a third layer profile and another with a fourth layer profile, wherein the third layer profile has a higher average aluminum content than the fourth layer profile and the fourth layer profile has a lower average aluminum content than the second layer profile of the first region; and wherein the buffer layer has a third region 84 comprising at least two layers, one having a fifth layer profile and another with a sixth layer profile, wherein the fifth layer profile has a higher average aluminum content than the sixth layer profile and the sixth layer profile has a lower average aluminum content than the fourth layer profile of the second region. As shown in FIG. 8, at least a portion of each layer having the fourth layer profile has a higher aluminum content than at least a portion of each layer having the second layer profile, and at least a portion of each layer having the sixth layer profile has a higher aluminum content than at least a portion of each layer having the fourth layer profile. Also, an initial aluminum content of the second layer profile in the growth direction is higher than an initial aluminum content of the fourth layer profile in the growth direction, and the initial aluminum content of the fourth layer profile in the growth direction is higher than an initial aluminum content of the sixth layer profile in the growth direction.

The aluminum content is shown as the y-axis in FIG. 8 and represents the value for "x" in the buffer layer formula of $Al_xIn_yGa_{1-x-y}N$, where x≤1 and 0≤y≤1. Further, in FIG. 8 the layers with a first layer profile, second layer profile, fourth layer profile, fifth layer profile and sixth layer profile have a variable aluminum content that continuously decreases throughout their thickness in the growth direction, while the layer with a third layer profile has a variable aluminum content that continuously increases throughout their thickness in the growth direction. FIG. 8 depicts the buffer layer in the first region 80 repeating the first layer profile and the second layer profile three times however, in one or more embodiments, a buffer layer may repeat the first layer profile and second layer profile in the first region 80 at least 5 times or at least 10 times and up to 20 times. Similarly, the buffer layer in the second region 82 is shown in FIG. 8 repeating the third layer profile and the fourth layer profile three times however, in one or more embodiments, a buffer layer may repeat the third layer profile and fourth layer profile in the second region 82 at least 5 times or at least 10 times and up to 20 times. Finally, the buffer layer in the third region 84 is shown in FIG. 8 repeating the fifth layer profile and the sixth layer profile three times however, in one or more embodiments, a buffer layer may repeat the fifth layer profile and sixth layer profile in the third region 84 at least 5 times or at least 10 times and up to 20 times.

In embodiments that have a buffer layer using a similar layer profile as what is depicted in FIG. 8 the aluminum content for the first layer profile, third layer profile, and fifth layer profile may be independently in a range from 0.9 to 1. The average aluminum content of the first layer profile, third layer profile, and fifth layer profile may be, for example, independently any value between 0.9 and 1. A difference between a highest aluminum content and a lowest aluminum content in each of the layers according to the second layer profile, fourth layer profile, and sixth layer profile is independently no more than 0.2, for example, 0.05, 0.1, 0.15, or 0.2. Further, the difference between the highest aluminum content and the lowest aluminum content in each of the layers according to the second layer profile, fourth layer profile, and sixth layer profile is different from each other. In the embodiment shown, the difference between the highest aluminum content and the lowest aluminum content in the layer according to the second layer profile is 0.1, the difference between the highest aluminum content and the lowest aluminum content in the layer according to the fourth layer profile is 0.15, and the difference between the highest aluminum content and the lowest aluminum content in the layer according to the sixth layer profile is 0.2. In other words, the difference between the highest aluminum content and the lowest aluminum content in the layer according to the second layer profile is smaller than the difference between the highest aluminum content and the lowest aluminum content in the layer according to the fourth layer profile, and the difference between the highest aluminum content and the lowest aluminum content in the layer according to the fourth layer profile is smaller than the difference between the highest aluminum content and the lowest aluminum content in the layer according to the sixth layer profile. For example, the highest aluminum content and the lowest aluminum for the second layer profile may be 0.8 and 0.7, respectively. In this example, the average aluminum content of the second layer profile is about 0.75. The highest aluminum content and the lowest aluminum for the fourth layer profile may be 0.75 and 0.6. In this example, the average aluminum content of the fourth layer profile is from about 0.67 to about 0.68. The highest aluminum content and the lowest for the sixth layer profile may be 0.65 and 0.45, respectively. In this example, the average aluminum content of the sixth layer profile is about 0.55. In one or more embodiments of the present disclosure, the terminal layer of the buffer layer (i.e., the last layer deposited prior to depositing the working group III-V semiconductor layer) may have at least a portion of the layer with an aluminum content equal to or less than 0.35, or equal to or less than 0.25.

In embodiments that have a buffer layer using a similar layer profile as what is depicted in FIG. 8, as described above, the fourth layer profile has a lower average aluminum content than the second layer profile, and the sixth layer profile has a lower average aluminum content than the fourth layer profile. On the other hand, the difference between the highest aluminum content and the lowest aluminum content in each of the layers according to the second layer profile, fourth layer profile, and sixth layer profile are different from each other. As such, in one or more embodiments, some or all of the ranges over which the aluminum content changes throughout the thickness of the layers according to the second layer profile, fourth layer profile, and sixth layer profile may overlap each other. In the embodiment shown in FIG. 8, the range over which the aluminum content changes throughout the thickness of the layer according to the second layer profile overlap the range over which the aluminum content changes throughout the thickness of the layer according to the fourth layer profile, and the range over which the aluminum content changes throughout the thickness of the layer according to the fourth layer profile overlap the range over which the aluminum content changes throughout the thickness of the layer according to the sixth layer profile. In particular, the highest aluminum content in the layer according to the second layer profile is higher than the highest aluminum content in the layer according to the fourth layer profile, and the lowest aluminum content in the layer according to the second layer profile is lower than the highest aluminum content in the layer according to the fourth layer profile. However, as stated above, the fourth layer profile has a lower average aluminum content than the second layer profile. Further, the highest aluminum content in the layer according to the fourth layer profile is higher than the highest aluminum content in the layer according to the sixth layer profile, and the lowest aluminum content in the layer according to the fourth layer profile is lower than the highest aluminum content in the layer according to the sixth layer profile. However, as stated above, the sixth layer profile has a lower average aluminum content than the fourth layer profile.

In some embodiments, the difference between the highest aluminum content and the lowest aluminum content in the layer according to the second layer profile may be greater than the difference between the highest aluminum content and the lowest aluminum content in the layer according to the fourth layer profile, and the difference between the highest aluminum content and the lowest aluminum content in the layer according to the fourth layer profile may be greater than the difference between the highest aluminum content and the lowest aluminum content in the layer according to the sixth layer profile. For example, the aluminum content for the second layer profile may be in a range from 0.65 to 0.85. The average aluminum content of the second layer profile may be, for example, 0.75. The aluminum content for the fourth layer profile may be in a range from 0.42 to 0.58. The average aluminum content of the fourth layer profile may be, for example, 0.5. The aluminum content for the sixth layer profile may be in a range from 0.2 to 0.3. The average aluminum content of the sixth layer profile may be, for example, 0.25. In one or more embodiments of the present disclosure, the terminal layer of the buffer layer (i.e., the last layer deposited prior to depositing the working group III-V semiconductor layer) may have at least a portion of the layer with an aluminum content equal to or less than 0.3, or equal to or less than 0.25. In general, the difference between the highest aluminum content and the lowest aluminum content in each of the layers according to the second layer profile, fourth layer profile, and sixth layer profile may be different from each other.

While each of the embodiments according to FIGS. 2-8 described above are shown in a particular way with respect to each of the layers according to the first, second, third, fourth, fifth, and sixth layer profiles, the present disclosure is not limited to these specific embodiments. For example, in one or more embodiments, the aluminum content of each of the layers according to the first, second, third, fourth, fifth, and sixth layer profiles may be independently selected from a group consisting of a constant aluminum content throughout a thickness of the layer, a continuously increasing aluminum content throughout the thickness of the layer, and a continuously decreasing aluminum content throughout the thickness of the layer. Therefore, any layer profile in any region as shown in one figure may be combined with any other layer profile(s) as shown in the same or another figure or with any other layer profile(s) according to the present disclosure but not shown.

In addition, the average aluminum content of each of the layers according to the first, second, third, fourth, fifth, and sixth layer profiles is not limited to the examples described above. For example, the average aluminum content of each of the layers according to the odd numbered layer profiles may be any value between 0.95 and 1. In this case, the aluminum content of each of the layers according to the odd numbered layer profiles may be independently in a range from any value greater than 0.9 to 1. For example, the average aluminum content of each of the layers according to the even numbered layer profiles may any suitable value while a difference between a highest aluminum content and a lowest aluminum content in each of the layers according to the even numbered layer profiles is independently no more than 0.2. In addition, the buffer layer may include a fourth or more regions that may also each include a layer with an odd numbered layer profile and another layer with an even numbered layer profile while an even numbered layer profile further away from the substrate has a lower average aluminum content than the previous even numbered layer profile. For example, when the buffer layer has N such regions, the lowest of the average aluminum content of the layers according to the even numbered layer profiles may be determined to be 100/(N+1). As moving toward the substrate from the layer having the lowest average aluminum content, the average aluminum content of each of the layers according to the even numbered layer profiles may be incremented by 100/(N+1). As an example, if N=4, the average aluminum content of the layers according to the even numbered layer profiles may be determined to be 80%, 60%, 40%, and 20%, respectively, as moving away from the substrate.

In one or more embodiments, the thickness of each of the layers according to the odd numbered layer profiles, measured in the growth direction, may independently be in a range from 3.5 to 7.5 nm. In one or more embodiments, the thickness of each of the layers according to the even numbered layer profiles, measured in the growth direction, may independently be in a range from 15 to 35 nm.

Figure 9:
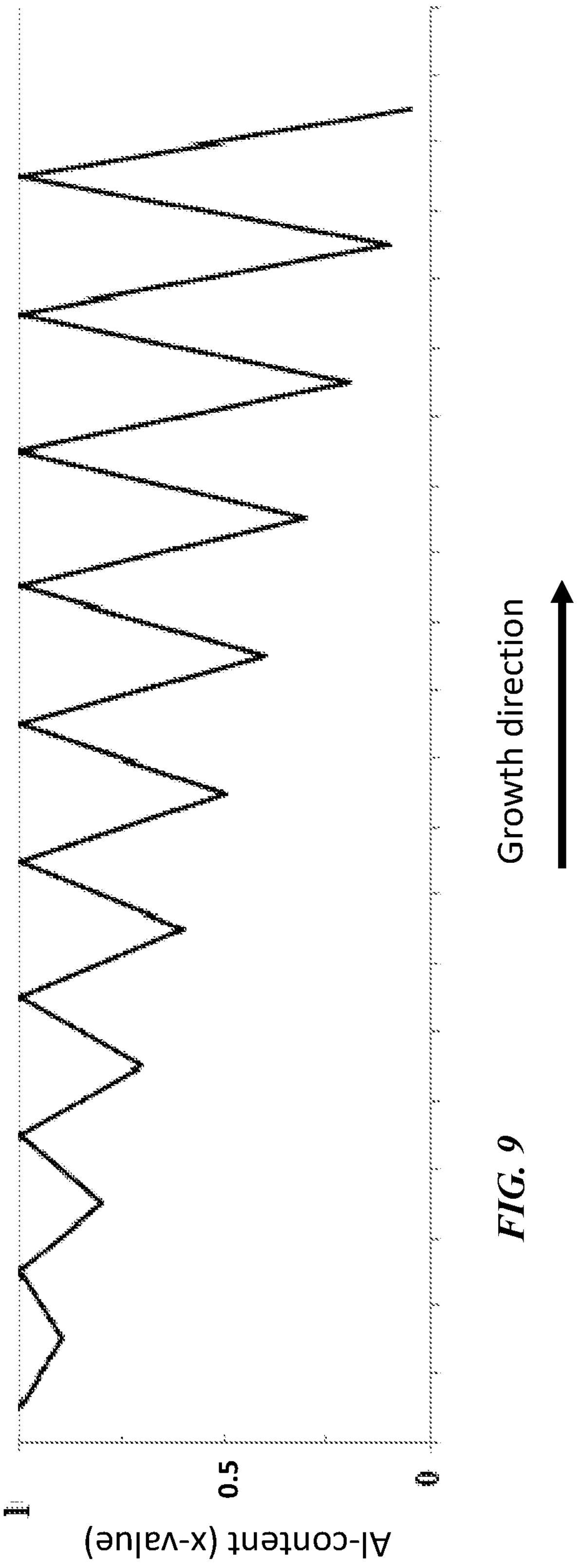
FIG. 9 depicts an embodiment of the composition of a buffer layer according to the present disclosure.

FIG. 9 depicts an embodiment of the composition of a buffer layer according to the present disclosure. As depicted, the aluminum content in a buffer layer having a formula of $Al_xIn_yGa_{1-x-y}N$, where x≤1 and 0≤y≤1, may be varied throughout the thickness of the buffer layer and wherein the content of aluminum continuously varies throughout the thickness of the buffer layer and includes repeating layers of continuously increasing aluminum content and layers of continuously decreasing aluminum content, along the growth direction of the buffer layer. In particular, in the embodiment shown in FIG. 9 the layers of increasing aluminum content all terminate in substantially the same aluminum content, which may range from about 0.9 to 1. The layers of decreasing aluminum content terminate in an aluminum content that is lower than the previously deposited layer of decreasing aluminum content. In one or more embodiments, the layers of decreasing aluminum content may include an aluminum content between about 1 and 0.01.

Figure 10:
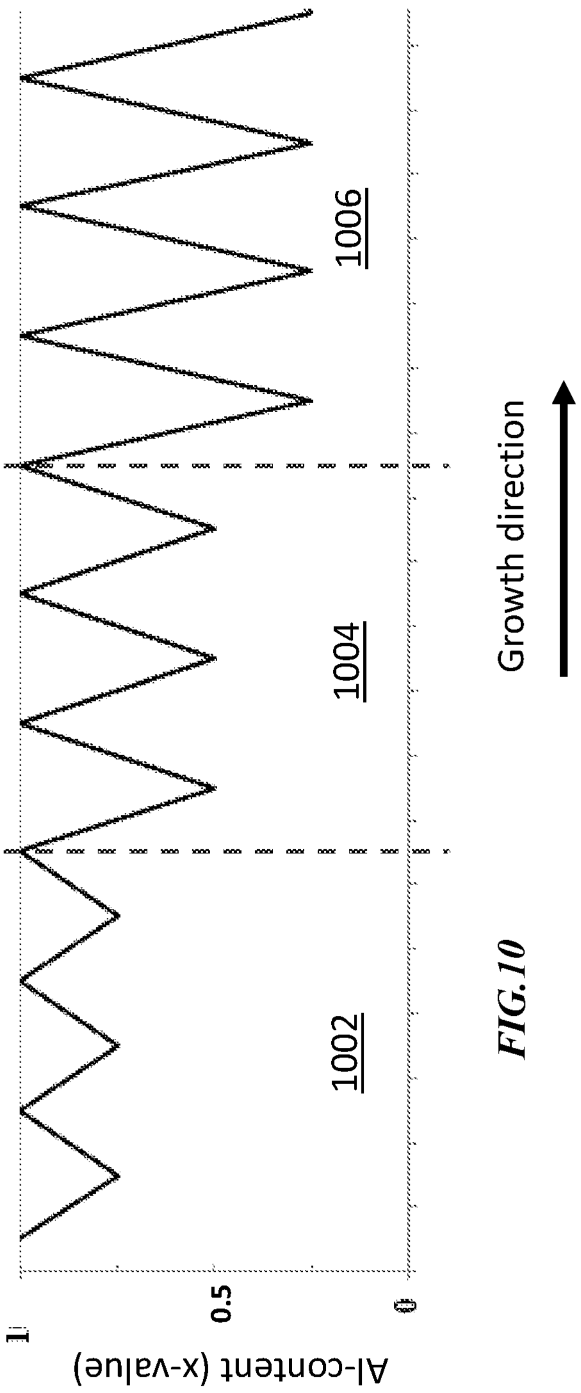
FIG. 10 depicts an embodiment of the composition of a buffer layer according to the present disclosure.

FIG. 10 depicts an embodiment of the composition of a buffer layer according to the present disclosure. As depicted, the aluminum content in a buffer layer having a formula of $Al_xIn_yGa_{1-x-y}N$, where x≤1 and 0≤y≤1, may be varied throughout the thickness of the buffer layer and wherein the content of aluminum continuously varies throughout the thickness of the buffer layer and includes repeating layers of continuously increasing aluminum content and layers of continuously decreasing aluminum content, along the growth direction of the buffer layer. In particular, in the embodiment shown in FIG. 10 the layers of increasing aluminum content all terminate at the same aluminum content, which may range from about 0.9 to 1. FIG. 10 also shows a buffer layer having a first region 1002, a second region 1004, and a third region 1006. The layers of decreasing aluminum content in the first region 1002 terminate in substantially the same aluminum content, the layers of decreasing aluminum content in the second region 1004 terminate in substantially the same aluminum content, and the layers of decreasing aluminum content in the third region 1006 terminate in substantially the same aluminum content. Further, the layers of decreasing aluminum content in the third region 1006 terminate in a lower aluminum content than the termination point of the layers of decreasing aluminum content in the first region 1002 and second region 1004. Additionally, the layers of decreasing aluminum content in the second region 1004 terminate in a lower aluminum content than the first region 1002. In one or more embodiments, the layers of decreasing aluminum content in the first region 1002 may include an aluminum content between about 1 and 0.75 and the layers of decreasing aluminum content in the second region 1004 may include an aluminum content between about 1 and 0.5, and the layers of decreasing aluminum content in the third region 1006 may include an aluminum content between about 1 and 0.01. Embodiments, that have a similar repeat structure as depicted in FIG. 10 (i.e., cycling between continuously decreasing and continuously increasing aluminum content) may repeat at least 5 times or at least 10 times and up to 20 times within any particular single region. However, the terminal layer profile in the buffer layer should terminate at an aluminum content equal to or less than 0.35, or equal to or less than 0.25.

Figure 11:
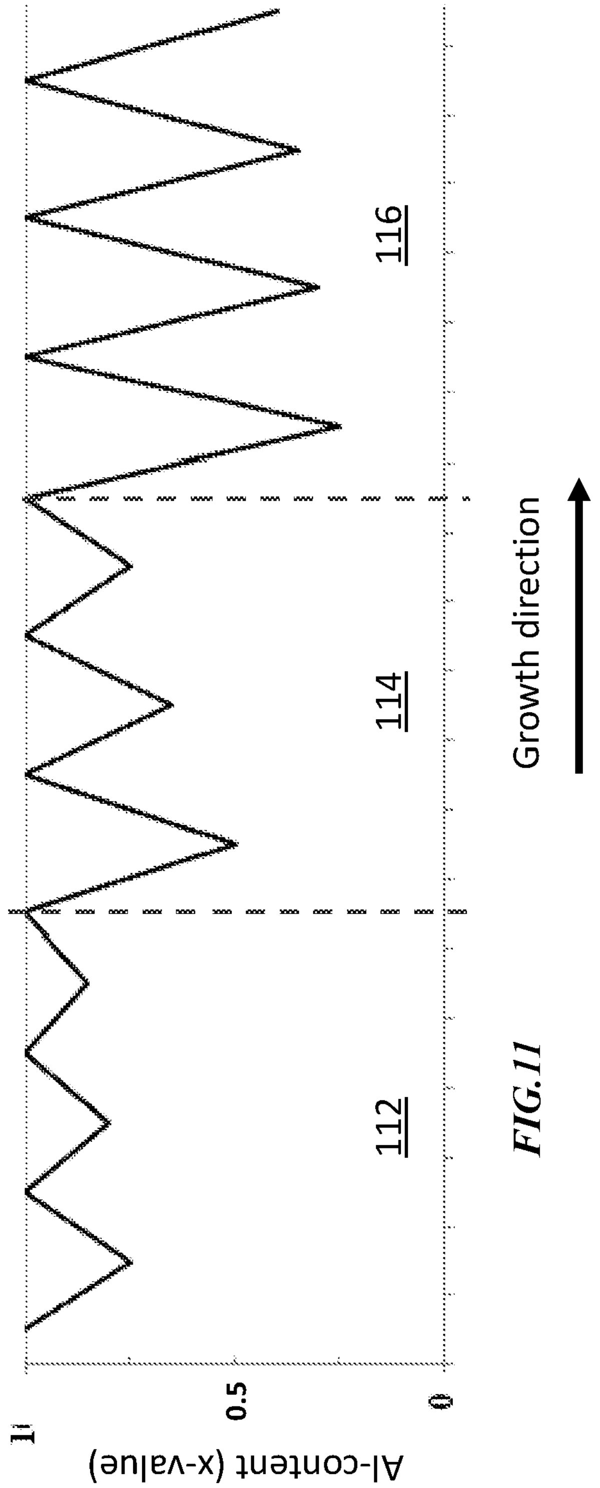
FIG. 11 depicts an embodiment of the composition of a buffer layer according to the present disclosure.

FIG. 11 depicts an embodiment of the composition of a buffer layer according to the present disclosure. As depicted, the aluminum content in a buffer layer having a formula of $Al_xIn_yGa_{1-x-y}N$, where x≤1 and 0≤y≤1, may be varied throughout the thickness of the buffer layer and wherein the content of aluminum continuously varies throughout the thickness of the buffer layer and includes repeating layers of continuously increasing aluminum content and layers of continuously decreasing aluminum content, along the growth direction of the buffer layer. In particular, in the embodiment shown in FIG. 11 the layers of increasing aluminum content all terminate at the same aluminum content, which may range from about 0.9 to 1. FIG. 11 also shows a buffer layer having a first region 112, a second region 114, and a third region 116. The layers of decreasing aluminum content in the first region 112 terminate in a progressively higher aluminum content than the initial decreasing layer when progressing in the growth direction, the layers of decreasing aluminum content in the second region 114 terminate in a higher aluminum content than the prior decreasing layer when progressing in the growth direction, and the layers of decreasing aluminum content in the third region 116 terminate in a higher aluminum content than the prior decreasing layer when progressing in the growth direction. Further, the layers of decreasing aluminum content in the third region 116 terminate in the lower aluminum content than the termination points of the layers of decreasing aluminum content in the first region 112 and second region 114. Additionally, the layers of decreasing aluminum content in the second region 114 terminate in the lower aluminum content, or substantially the same aluminum content, than the first region 112. In one or more embodiments, the layers of decreasing aluminum content in the first region 112 may include an aluminum content between about 1 and 0.75 and the layers of decreasing aluminum content in the second region 114 may include an aluminum content between about 1 and 0.5, and the layers of decreasing aluminum content in the third region 116 may include an aluminum content between about 1 and 0.01. Embodiments, that have a similar repeat structure as depicted in FIG. 11 (i.e., cycling between continuously decreasing and continuously increasing aluminum content) may repeat at least 5 times or at least 10 times and up to 20 times within any particular single region. However, the terminal layer profile in the buffer layer should terminate at an aluminum content equal to or less than 0.35, or equal to or less than 0.25.

Figure 12:
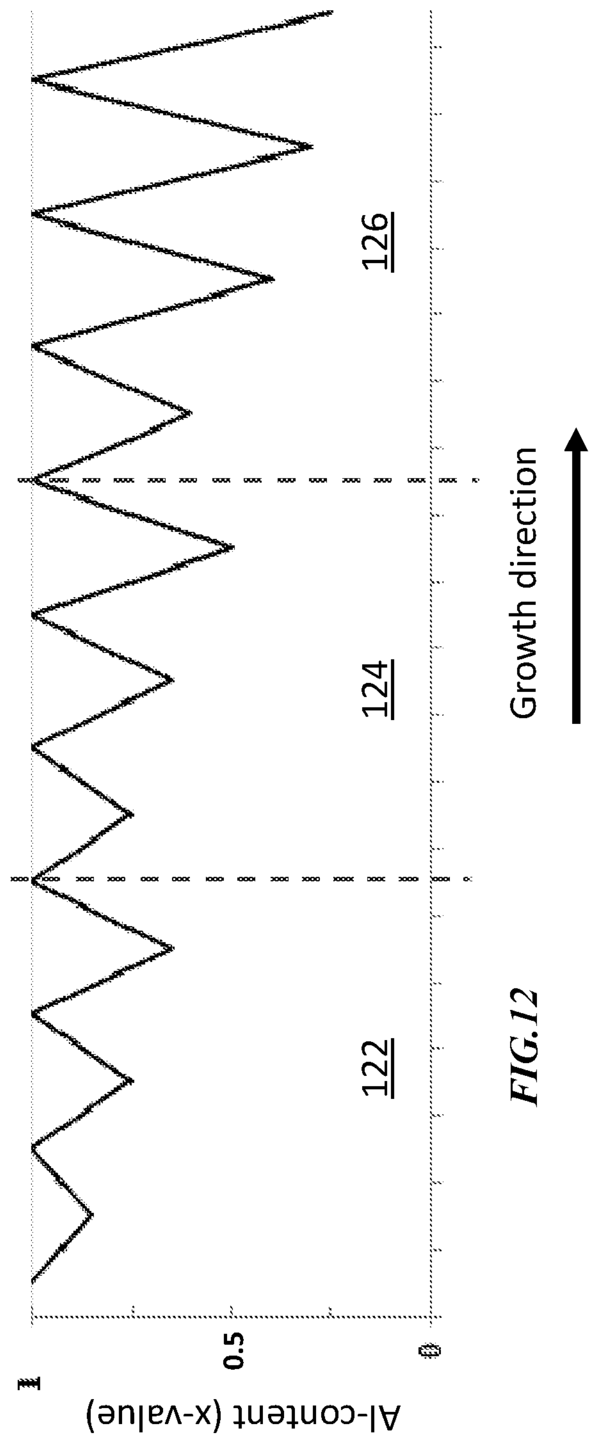
FIG. 12 depicts an embodiment of the composition of a buffer layer according to the present disclosure.

FIG. 12 depicts an embodiment of the composition of a buffer layer according to the present disclosure. As depicted, the aluminum content in a buffer layer having a formula of $Al_xIn_yGa_{1-x-y}N$, where x≤1 and 0≤y≤1, may be varied throughout the thickness of the buffer layer and wherein the content of aluminum continuously varies throughout the thickness of the buffer layer and includes repeating layers of continuously increasing aluminum content and layers of continuously decreasing aluminum content, along the growth direction of the buffer layer. In particular, in the embodiment shown in FIG. 12 the layers of increasing aluminum content all terminate at the same aluminum content, which may range from about 0.9 to 1. FIG. 12 also shows a buffer layer having a first region 122, a second region 124, and a third region 126. The layers of decreasing aluminum content in the first region 122 terminate in a progressively lower aluminum content than the prior decreasing layer when progressing in the growth direction, the layers of decreasing aluminum content in the second region 124 terminate in a progressively lower aluminum content than the prior decreasing layer when progressing in the growth direction, and the layers of decreasing aluminum content in the third region 126 terminate in a progressively lower aluminum content than the prior decreasing layer when progressing in the growth direction. Further, the layers of decreasing aluminum content in the third region 126, with exception of the initial decreasing layer, terminate in a lower aluminum content than the termination points of the layers of decreasing aluminum content in the first region 122 and second region 124. Additionally, the layers of decreasing aluminum content in the second region 124, with the exception of the initial decreasing layer, terminate in a lower aluminum content, or substantially the same aluminum content, than the first region 122. In one or more embodiments, the layers of decreasing aluminum content in the first region 122 may include an aluminum content between about 1 and 0.75 and the layers of decreasing aluminum content in the second region 114 may include an aluminum content between about 1 and 0.5, and the layers of decreasing aluminum content in the third region 116 may include an aluminum content between about 1 and 0.01. Embodiments, that have a similar repeat structure as depicted in FIG. 12 (i.e., cycling between continuously decreasing and continuously increasing aluminum content) may repeat at least 5 times or at least 10 times and up to 20 times within any particular single region. However, the terminal layer profile in the buffer layer should terminate at an aluminum content equal to or less than 0.35, or equal to or less than 0.25.

In general, the layers of the buffer layer, and the group III-V working layer, may be deposited by epitaxially on the substrate using ammonia ($NH_3$) as the nitrogen source, trimethylaluminium (TMAl) or triethylaluminium (TEAl) as the aluminum source, trimethylgallium (TMGa) or triethylgallium (TEGa) as the gallium source, and trimethylindium (TMIn) as the indium source. These reactants may be reacted in the gas phase and their relative ratios are modulated during the reaction in order to produce buffer layers that have the desired layer profile. For example, for a layer that has a constant composition the ratio of reactants may remain substantially the same throughout the reaction/deposition of the layer, while a layer that has a continuously increasing aluminum content may have the reactants modulated during the reaction/deposition so that the aluminum content is continuously increasing. Further aspects of the deposition process that may be modulated to affect the composition of the layers deposited may include the growth rate, pressure, and/or the growth temperature during the buffer layer's fabrication. In one or more embodiments, only one of the factors discussed above may be manipulated to modulate/adjust the aluminum content during the growth of the buffer layer or, in other embodiments, two or more of these factors may be manipulated to modulate/adjust the aluminum content.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed is:

1. A heterostructure, comprising:

a substrate; and a buffer layer comprising a plurality of layers having a composition $Al_xIn_yGa_{1-x-y}N$, where $x \leq 1$ and $0 \leq y \leq 1$, wherein the buffer layer has a first region comprising at least two layers, one according to a first layer profile and another according to a second layer profile, wherein the first layer profile has a higher average aluminum content than the second layer profile, wherein the buffer layer has a second region comprising at least two layers, one according to a third layer profile and another according to a fourth layer profile, wherein the third layer profile has a higher average aluminum content than the fourth layer profile and the fourth layer profile has a lower average aluminum content than the second layer profile of the first region, wherein the buffer layer has a third region comprising at least two layers, one according to a fifth layer profile and another according to a sixth layer profile, wherein the fifth layer profile has a higher average aluminum content than the sixth layer profile and the sixth layer profile has a lower average aluminum content than the fourth layer profile of the second region, wherein the aluminum content varies continuously throughout a thickness of at least one of the layers according to the first, second, third, fourth, fifth, and sixth layer profiles, and wherein the aluminum content of each of the layers according to the odd numbered layer profiles is independently in a range from 0.9 to 1.

2. The heterostructure of claim 1, wherein the aluminum content of each of the layers according to the first, second, third, fourth, fifth, and sixth layer profiles is independently selected from a group consisting of a constant aluminum content throughout a thickness of the layer, a continuously increasing aluminum content throughout the thickness of the layer, and a continuously decreasing aluminum content throughout the thickness of the layer.

3. The heterostructure of claim 1, wherein a difference between a highest aluminum content and a lowest aluminum content in each of the layers according to the even numbered layer profiles is independently no more than 0.2.

4. The heterostructure of claim 3, wherein a difference between a highest aluminum content and a lowest aluminum content in each of the layers according to the even numbered layer profiles is different from each other.

5. The heterostructure of claim 3, wherein the difference between the highest aluminum content and the lowest aluminum content in the layer according to the second layer profile is smaller than the difference between the highest aluminum content and the lowest aluminum content in the layer according to the fourth layer profile, and wherein the difference between the highest aluminum content and the lowest aluminum content in the layer according to the fourth layer profile is smaller than the difference between the highest aluminum content and the lowest aluminum content in the layer according to the sixth layer profile.

6. The heterostructure of claim 3, wherein the difference between the highest aluminum content and the lowest aluminum content in the layer according to the second layer profile is greater than the difference between the highest aluminum content and the lowest aluminum content in the layer according to the fourth layer profile, and wherein the difference between the highest aluminum content and the lowest aluminum content in the layer according to the fourth layer profile is greater than the difference between the highest aluminum content and the lowest aluminum content in the layer according to the sixth layer profile.

7. The heterostructure of claim 1, wherein at least one pair of layer profiles selected from the first layer profile and the second layer profile, the third layer profile and the fourth layer profile, and the fifth layer profile and the sixth layer profile repeats at least one time within the first region, the second region, or the third region, respectively.

8. The heterostructure of claim 1, wherein the buffer layer has a thickness, measured in a growth direction, of at least 1 micrometer.

9. The heterostructure of claim 1, wherein each individual layer independently has a thickness, measured in a growth direction, between about 1 nanometer and 50 nanometers.

10. The heterostructure of claim 1, wherein the thickness of the layers with odd numbered layer profiles is substantially the same and/or the thickness of the layers with even numbered layer profiles is substantially the same.

11. The heterostructure of claim 10, wherein the thickness of the layers with odd numbered layer profiles is different from the thickness of layers with even numbered layer profiles.

12. The heterostructure of claim 1, wherein an initial aluminum content of the second layer profile in a growth direction is higher than an initial aluminum content of the fourth layer profile in the growth direction, and wherein the initial aluminum content of the fourth layer profile in the growth direction is higher than an initial aluminum content of the sixth layer profile in the growth direction.

13. The heterostructure of claim 1, wherein a thickness of each of the layers according to the odd numbered layer profiles, measured in a growth direction, is independently in a range from 3.5 to 7.5 nm.

14. The heterostructure of claim 1, wherein a thickness of each of the layers according to the even numbered layer profiles, measured in the growth direction, is independently in a range from 15 to 35 nm.

15. A heterostructure, comprising:

a substrate; and a buffer layer having a composition $Al_xIn_yGa_{1-x-y}N$, where $x \leq 1$ and $0 \leq y \leq 1$, wherein the buffer layer comprises:

a first region comprising at least two layers, one with a first layer profile and another with a second layer profile, wherein the first layer profile has a continuously decreasing aluminum content and the second layer profile has a continuously increasing aluminum content;

a second region comprising at least two layers, one with a third layer profile and another with a fourth layer profile, wherein the third layer profile has a continuously decreasing aluminum content and the fourth layer profile has a continuously increasing aluminum content; and a third region comprising at least two layers, one with a fifth layer profile and another with a sixth layer profile, wherein the fifth layer profile has a continuously decreasing aluminum content and the sixth layer profile has a continuously increasing aluminum content, wherein at least one pair of layer profiles selected from the first layer profile and second layer profile, third layer profile and fourth layer profile, and fifth layer profile and sixth layer profile repeats at least one time within the first region, second region, or third region, respectively, and wherein along a growth direction of at least one of the first region, second region, or third region, respectively, each successive layer with continuously decreasing aluminum content terminates at a different aluminum content.

16. The heterostructure of claim 15, wherein along the growth direction of at least one of the first region, second region, or third region, respectively, each successive layer with continuously decreasing aluminum content terminates at a higher aluminum content, wherein the aluminum content at a termination of an initial layer having the third layer profile of the second region is lower than the aluminum content at a termination of an initial layer having the first layer profile of the first region, and wherein the aluminum content at a termination of an initial layer having the fifth layer profile of the third region is lower than the aluminum content at the termination of the initial layer having a third layer profile of the second region.

17. The heterostructure of claim 15, wherein along the growth direction of at least one of the first region, second region, or third region, respectively, each successive layer with continuously decreasing aluminum content terminates at a lower aluminum content, wherein the aluminum content at a termination of an initial layer having the third layer profile of the second region is lower than the aluminum content at a termination of an initial layer having the first layer profile of the first region but higher than the aluminum content at a termination of a terminally grown layer with continuously decreasing aluminum content of the first region, wherein the aluminum content at a termination of an initial layer having the fifth layer profile of the third region is lower than the aluminum content at the termination of the initial layer having the third layer profile of the second region but higher than the aluminum content at a termination of a terminally grown layer with continuously decreasing aluminum content of the second region.

18. A method for fabricating a heterostructure, comprising:

depositing a buffer layer comprising a plurality of layers having a composition $Al_xIn_yGa_{1-x-y}N$, where $x \leq 1$ and $0 \leq y \leq 1$ on a substrate, wherein the buffer layer has a first region comprising at least two layers, one according to a first layer profile and another according to a second layer profile, wherein the first layer profile has a higher average aluminum content than the second layer profile, wherein the buffer layer has a second region comprising at least two layers, one according to a third layer profile and another according to a fourth layer profile, wherein the third layer profile has a higher average aluminum content than the fourth layer profile and the fourth layer profile has a lower average aluminum content than the second layer profile of the first region, wherein the buffer layer has a third region comprising at least two layers, one according to a fifth layer profile and another according to a sixth layer profile, wherein the fifth layer profile has a higher average aluminum content than the sixth layer profile and the sixth layer profile has a lower average aluminum content than the fourth layer profile of the second region, wherein the aluminum content varies continuously throughout a thickness of at least one of the layers according to the first, second, third, fourth, fifth, and sixth layer profiles, and wherein the aluminum content of each of the layers according to the odd numbered layer profiles is independently in a range from 0.9 to 1.

* * * * *